United States Patent [19]

Sandhu

[11] Patent Number: 5,480,684
[45] Date of Patent: Jan. 2, 1996

[54] METHOD OF REDUCING CARBON INCORPORATION INTO FILMS PRODUCED BY CHEMICAL VAPOR DEPOSITION INVOLVING ORGANOMETALLIC PRECURSOR COMPOUNDS

[75] Inventor: Gurtej S. Sandhu, Boise, Id.

[73] Assignee: Micron Technology, Inc., Boise, Id.

[21] Appl. No.: 299,505

[22] Filed: Sep. 1, 1994

[51] Int. Cl.$^6$ .......................... C23C 14/14; C23C 14/48
[52] U.S. Cl. ...................... 427/531; 427/530; 427/255.1; 427/255.2; 427/255.7; 427/255
[58] Field of Search ................................. 427/531, 530, 427/255.7, 255.2, 255.1, 255

[56] References Cited

U.S. PATENT DOCUMENTS 5,320,878  6/1994  Maya ........................................ 427/573

OTHER PUBLICATIONS

J. R. Conrad et al., "Ion Beam Assisted Coating and Surface Modification with Plasma Source Ion Implantation", J. Vac. Sci. Technol. A 8 (4), Jul./Aug. 1990 pp. 3146–3151.
Niemer et al., "Organometallic Chemical Vapor Deposition of Tungsten Metal, and Suppression of Carbon Incorporation by Codeposition of Platinum," Annl. Phys. Lett. 61 (15) Oct. 1992 pp. 1793–1795.

*Primary Examiner*—Roy V. King
*Attorney, Agent, or Firm*—Wells, St. John, Roberts, Gregory & Matkin

[57] ABSTRACT

A chemical vapor deposition method of providing a layer of material atop a semiconductor wafer using an organometallic precursor includes, a) positioning a wafer within a chemical vapor deposition reactor; b) injecting an organometallic precursor and a carrier gas to within the reactor having the wafer positioned therein; c) maintaining the reactor at a temperature and a pressure which in combination are effective to deposit a layer of material onto the wafer which incorporates metal and carbon from the organometallic precursor; d) after depositing the layer of material, ion implanting a late transition metal into the layer to a selected dose; and e) after ion implanting, annealing the layer in the presence of a hydrogen source gas which effectively diffuses into the layer, hydrogen atoms of the hydrogen source gas being catalyzed by the late transition metal within the layer into hydrogen radicals, the hydrogen radicals reacting with carbon in the layer to produce gaseous products which diffuse outwardly of the wafer and are expelled from the reactor.

28 Claims, 2 Drawing Sheets

METHOD OF REDUCING CARBON INCORPORATION INTO FILMS PRODUCED BY CHEMICAL VAPOR DEPOSITION INVOLVING ORGANOMETALLIC PRECURSOR COMPOUNDS

TECHNICAL FIELD

This invention relates to methods of reducing carbon incorporation into films produced by chemical vapor deposition involving organometallic precursor compounds, and particularly to such methods employing post deposition anneal treatments.

BACKGROUND OF THE INVENTION

Chemical vapor deposition is defined as the formation of a non-volatile solid film on a substrate by the reaction of vapor phase reactants that contain desired components. The gases are introduced into a reactor vessel, and decompose and react at a heated surface on the wafer to form the desired film. Chemical vapor deposition is but one process of providing thin films on semiconductor wafers, such as films of elemental metals of compounds. It is a favored deposition process in many respects, principally because of its ability to provide highly conformal layers even within deep contacts and other openings.

One class of compounds finding increasing use in chemical vapor deposition of metals and metal compounds are organometallic precursors. Specifically, an example is the reaction of a titanium organometallic precursor of the formula $Ti(N(CH_3)_2)_4$, named tetrakisdimethylamidotitanium (TDMAT) and ammonia in the presence of a carrier gas which reacts to produce TiN according to the following formula:

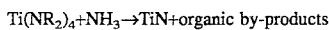

Organometallic compounds contain a central or linking atom or ion (Ti in TDMAT) combined by coordinate bonds with a definite number of surrounding ligands, groups or molecules, with at least one of which is organic (the $(N(CH_3)_2$ groups in TDMAT). The central or linking atom as accepted within the art may not be a "metal" in the literal sense. As accepted within the art of organometallic compounds, the linking atom could be anything other than halogens, the noble gases, H, C, N, O, P, S, Se, and Te.

The above and other chemical vapor deposition reactions involving organometallics are typically conducted at low pressures of less than 1 Torr. It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in resistivity. For example, oxygen incorporation into the film before and after deposition results in higher resistivity. Additionally, it is believed that organic incorporation (specifically pure carbon or hydrocarbon incorporation) into the resultant film reduces density and resistivity. Such organic incorporation can result from carbon radicals from the organic portion of the precursor becoming incorporated into the film, as opposed to being expelled with the carrier gas. Carbon incorporation can also cause other undesired attributes in the deposited film, such as low density and poor long term reliability.

Hydrogen is a known capable reactant with deposited carbon or metal carbides. Such will react with carbon atoms to form volatile hydrocarbons. Hydrogen radicals are more reactive than elemental hydrogen or hydrogen ions in producing volatile hydrocarbons. Platinum is a known hydrogenation catalyst which produces hydrogen radicals from hydrogen or hydrogen compounds, such as is reported in Niemer et al., *"Organometallic Chemical Vapor Deposition Of Tungsten Metal, And Suppression Of Carbon Incorporation By Codeposition Of Platinum"*, Applied Physics Letters (61)15 pp. 1793–95 (Oct. 12, 1992).

It would be desirable to improve upon these and other prior art chemical vapor deposition processes in producing layers having minimal incorporated carbon.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a chemical vapor deposition method of providing a layer of material atop a semiconductor wafer using an organometallic precursor comprises the following steps:

positioning a wafer within a chemical vapor deposition reactor;

injecting an organometallic precursor and a carrier gas to within the reactor having the wafer positioned therein;

maintaining the reactor at a temperature and a pressure which in combination are effective to deposit a layer of material onto the wafer which incorporates metal and carbon from the organometallic precursor;

after depositing the layer of material, ion implanting a late transition metal into the layer to a selected dose; and after ion implanting, annealing the layer in the presence of a hydrogen source gas which effectively diffuses into the layer, hydrogen atoms of the hydrogen source gas being catalyzed by the late transition metal within the layer into hydrogen radicals, the hydrogen radicals reacting with carbon in the layer to produce gaseous products which diffuse outwardly of the wafer and are expelled from the reactor.

In accordance with another aspect of the invention, a chemical vapor deposition method of providing a layer of material atop a semiconductor wafer using an organometallic precursor comprises the following steps:

positioning a wafer within a chemical vapor deposition reactor;

injecting an organometallic precursor and a carrier gas to within the reactor having the wafer positioned therein;

maintaining the reactor at a temperature and a pressure which in combination are effective to deposit a first layer of first material onto the wafer which incorporates metal and carbon from the organometallic precursor;

after depositing the first layer, depositing a discrete second layer of second material onto the wafer, the second layer comprising a late transition metal; and after depositing the discrete second layer, annealing the wafer in the presence of a hydrogen source gas which effectively diffuses into the first and second layers, hydrogen of the hydrogen source gas being catalyzed by the late transition metal within the second layer to form hydrogen atoms or radicals, the hydrogen atoms or radicals diffusing into the first layer and reacting with carbon in the first layer to produce gaseous products which diffuse outwardly of the wafer and are expelled from the reactor.

Figure 1:
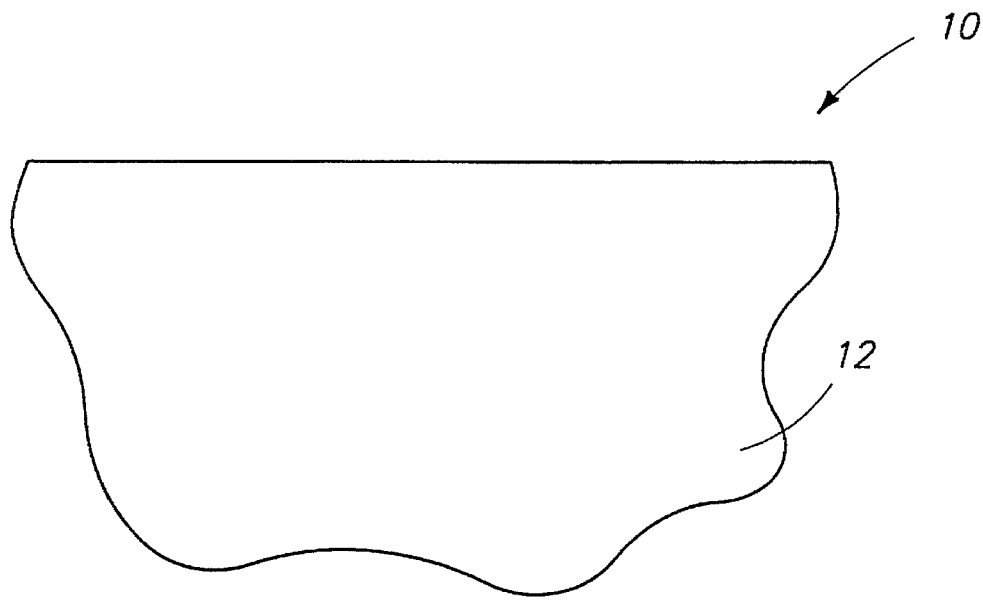
FIG. 1 is a diagrammatic cross section of a semiconductor wafer fragment at a processing step in accordance with as aspect of the invention.
Figure 2:
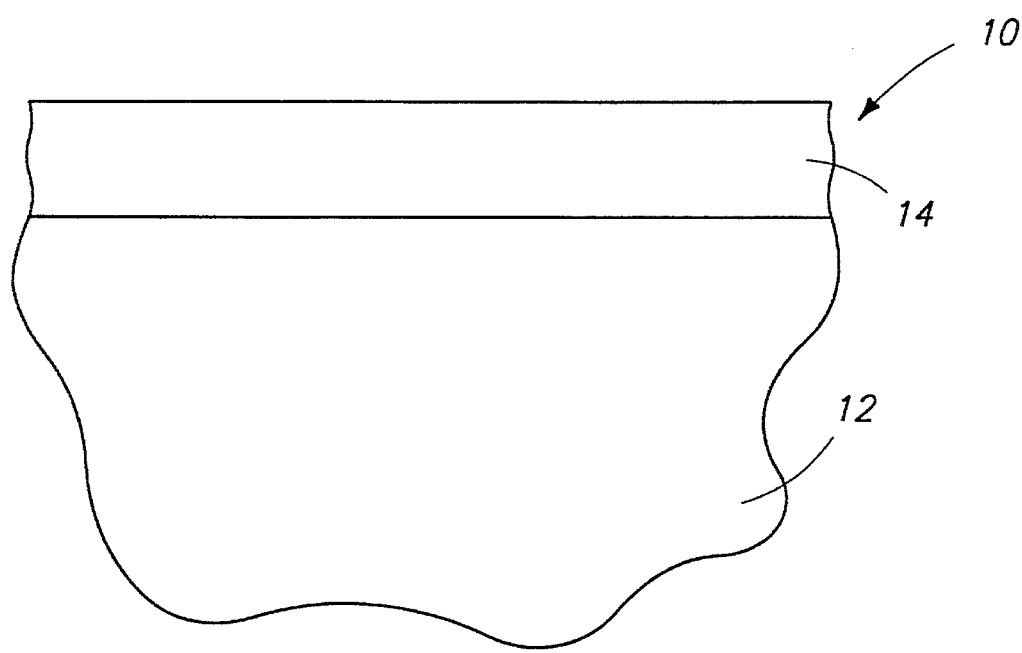
FIG. 2 is a view of the FIG. 1 wafer shown at a processing step subsequent to that shown by FIG. 1.
Figure 3:
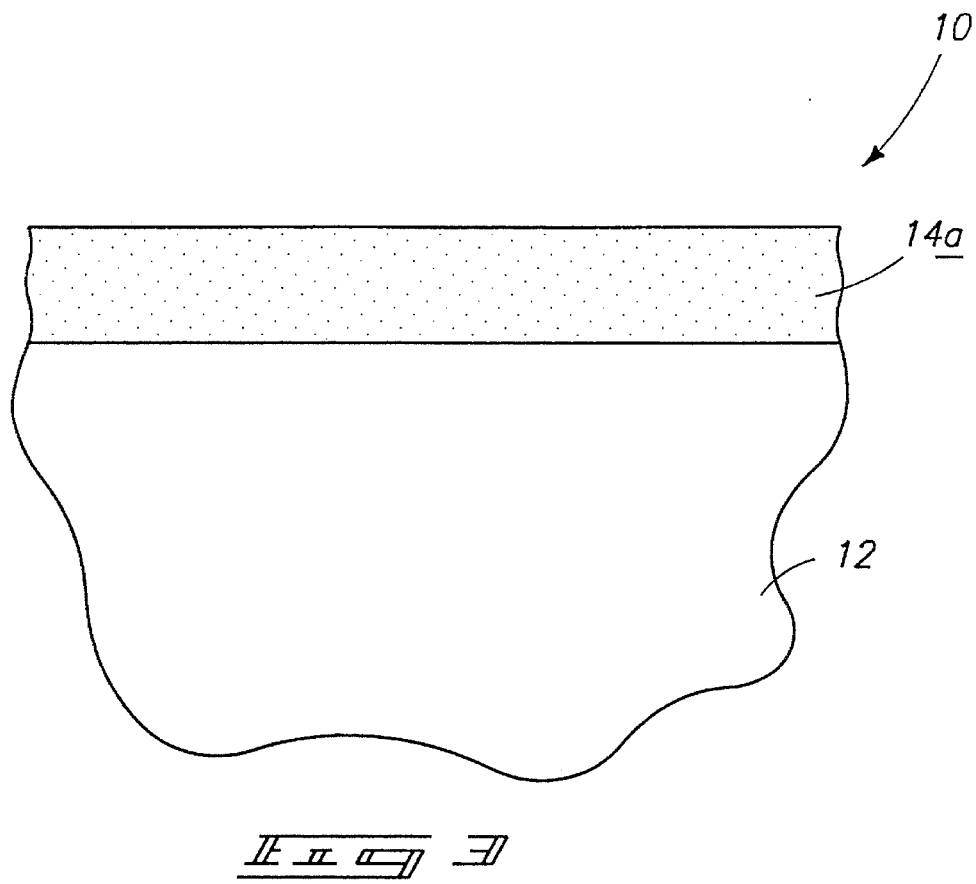
FIG. 3 is a view of the FIG. 1 wafer shown at a processing step subsequent to that shown by FIG. 2.

More particularly and first with reference to FIGS. 1–3, a semiconductor wafer is indicated generally by reference numeral 10. Such is comprised of a bulk substrate 12, and would be positioned within a chemical vapor deposition reactor (not shown). An organometallic precursor and a carrier gas would be injected within the reactor having wafer 10 positioned therein. Example and preferred organometallic precursors would be titanium organometallic precursors, such as TDMAT. The reactor would be maintained at temperature and a pressure which in combination are effective to deposit a layer 14 (FIG. 2) of material onto wafer 10 which incorporates both metal and carbon from the organometallic precursor. For example, TDMAT could be utilized in the above-described manner to deposit a layer of titanium or titanium nitride atop the wafer. Preferably, conditions (including prior art conditions) are utilized which minimizes carbon incorporation. But nevertheless, undesired carbon will be incorporated into film 24.

Alternately where for example it is desired to deposit a layer of TiN, a gaseous nitrogen source (such as $NH_3$) would be simultaneously fed to the reactor to deposit a layer which predominantly comprises TiN. By way of example only, TDMAT would be heated to 40° C., and helium as a carrier gas flowed therethrough at a rate of 5–25 standard cubic centimeters per minute (sccm). $NH_3$ flow could be provided at 10–50 sccm. The wafer would be heated to from 200°–400° C., with an example system pressure being from 10–800 mTorr. The chamber size for the above-described example would provide an internal volume of from 500 cc–750 cc. An example deposition time would be anywhere from 2 to 10 minutes, to provide a layer 14 having a thickness ranging anywhere from 100 Angstroms to 1000 Angstroms.

After depositing layer 14 and with reference to FIG. 3, layer 14 is ion implanted with a late transition metal at a selected dose to provide ion implanted layer 14a. In the context of this document, "late transition metal" is utilized in its art accepted definition as any and all metals to the right of and including Group VI (Cr, Mo, W) on the periodic table up to and including Group Ib (Cu, Ag, Au). Preferred examples include platinum, palladium, nickel rhodium, iron, and cobalt, with platinum believed to be most preferred. An example and preferred ion implant dose is from $1 \times 10^{14}$ to $1 \times 10^{16}$ atoms/cm$^2$, with a preferred implanted density being from $1 \times 10^{18}$ to $1 \times 10^{21}$ atoms/cm$^3$.

After the ion implantation, layer 14a is annealed in the presence of a hydrogen source gas which effectively diffuses into layer 14a. Hydrogen atoms of the hydrogen source gas are catalyzed by the late transition metal within layer 14a into hydrogen radicals. The hydrogen radicals react with carbon in layer 14a to produce gaseous products which diffuse outwardly of layer 14a, and accordingly from the wafer where they are ultimately expelled from the reactor. Example hydrogen source gases include $H_2$, $SiH_4$, $B_2H_6$, $BH_3$, $NH_3$, and $H_2S$, with $H_2$ being most preferred. Example conditions for such a treatment would be rapid thermal processing with $H_2$. $H_2$ could be provided at a flow of 50–200 sccm, with the temperature ramped from 200° to 800° C. in one minute or less, and thereafter held for 30 seconds at 800° C. Reactor pressure during such processing would be from about 50 mTorr to about 760 Torr. Afterwards, the wafer is cooled quickly to a temperature at below 300° C.

Figure 4:
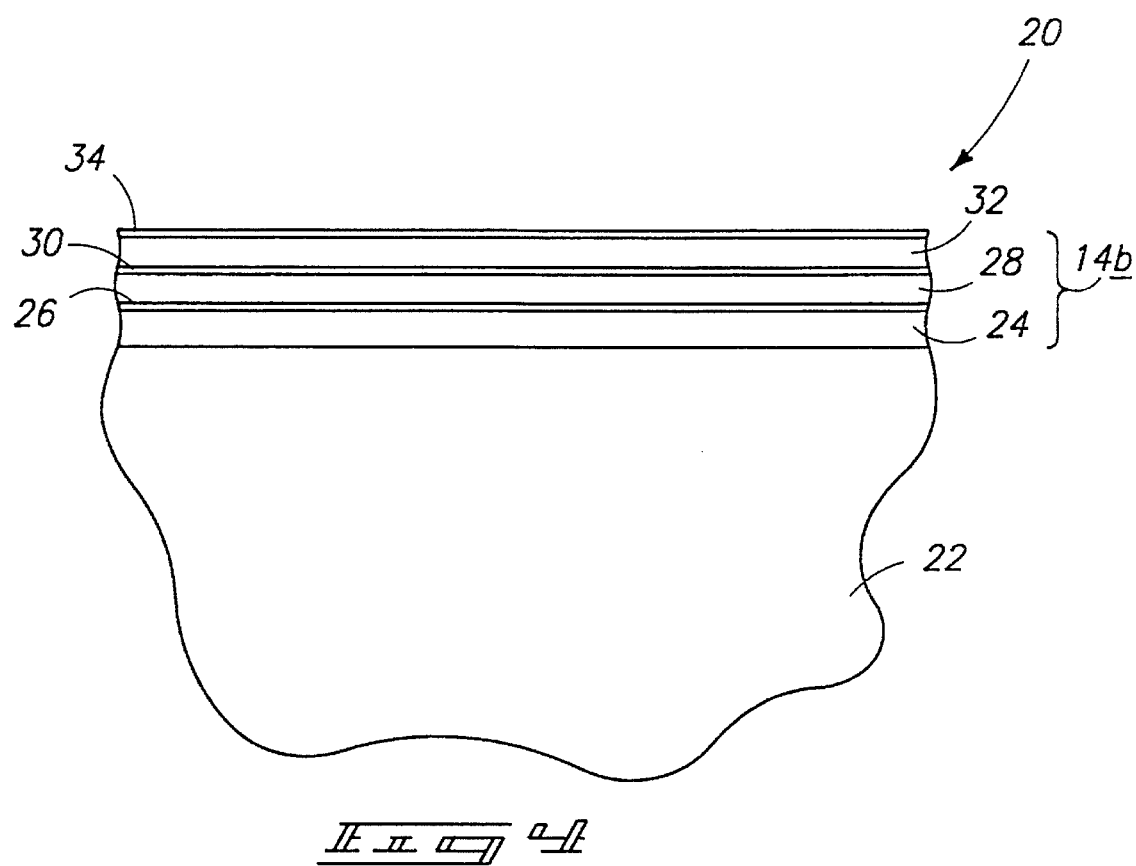
FIG. 4 is a diagrammatic cross section of an alternate embodiment semiconductor wafer fragment at a processing step in accordance with another aspect of the invention.

FIG. 4 illustrates an alternate embodiment semiconductor wafer processed in accordance with an alternate aspect of the invention. FIG. 4 illustrates a wafer fragment 20 comprised of a bulk substrate region 22. Such would be positioned within a chemical vapor deposition reactor for processing. With the wafer so positioned, an organometallic precursor, such as any of those described above, would be injected along with a carrier gas. The reactor would again be maintained at a pressure and temperature which in combination are effective to deposit a first layer 24 onto the wafer which incorporates metal and carbon from the organometallic precursor. Preferably as above, conditions are preferably utilized which minimize carbon incorporation, but nevertheless undesired carbon will be incorporated into film 24. An example thickness range for layer 24 would be from about 10–500 Angstroms.

A second layer 26 of a second material would be deposited onto the wafer, with the second layer of material comprising a late transition metal. An example and preferred technique for depositing layer 26 would be by sputtering. Such can be utilized to form second material layer 26 in the form of elemental or alloyed late transition metal, such as any of those metals described above. An alternate method for providing layer 26 would be to provide a gaseous form of a late transition metal within the reactor. The reactor would be maintained at a temperature and a pressure which in combination are effective to deposit second layer 26 which incorporates the late transition metal. By way of example only, an example gaseous form of the late transition metal might be provided in the form of cyclopentadienyltrimethyl platinum. Such compound would be heated to 140° C. and combined with a carrier gas flow of helium of 50–150 sccm. Reactor conditions would be, by way of example only, heating the wafer to 200°–400° C., with pressure ranging from 10–800 mTorr. Reactor volume again for this example is from 500 cc–750 cc.

Preferably, first layer 24 is deposited to be thicker than second layer 26. Most preferably, layer 26 is deposited as a mono-atomic thick layer of the transition metal, having a preferred thickness of from 2 Angstroms to 200 Angstroms.

Referring further to FIG. 4, a subsequent first material layer 28 is deposited, followed by a subsequent second material layer 30, followed by another subsequent first material layer 32, and finally an overlying layer 34 of second material. Thus, a plurality of first layers and a plurality of second layers are alternatingly discrete deposited atop one another to produce a sandwich-like construction.

Thereafter, the wafer is annealed in a preferred manner as described above in the presence of a hydrogen source gas. Such will effectively cause the source gas to diffuse into the illustrated alternating first and second layers. Hydrogen atoms of the hydrogen source gas will be catalyzed by the late transition metal within the second material layers into hydrogen radicals as they diffuse downwardly. The hydrogen radicals will diffuse into the first layer material and react with carbon therein to produce gaseous products which diffuse outwardly of the wafer and are expelled from the reactor. The finished composite layer 14b after the annealing step will substantially comprise the first material.

Although the above example is described with reference to provision of multiple alternating layers, the invention also contemplates provision of only a single second layer with a single first layer, and regardless of deposition order.

The invention was reduced to practice using two wafers processed in accordance with different aspects of the invention in comparison with a non-invention control wafer. All wafers constituted a silicon wafer having a 1000 Angstrom thick layer of $SiO_2$ thereatop. The control wafer additionally had two discretely deposited layers of TiN, the first being 150 Angstroms thick with the second being 500 Angstroms thick. The first wafer processed in accordance with the invention had a 500 Angstrom thick layer of TiN atop the $SiO_2$, with a 200 Angstrom thick layer of elemental platinum atop the TiN, followed by a 150 Angstrom thick layer of TiN atop the platinum. The second wafer processed in accordance with the invention had an 800 Angstrom thick layer of elemental platinum atop the $SiO_2$, with a 150 Angstrom thick layer atop the platinum. All wafers were annealed in a 100% $H_2$ atmosphere at 100 Torr at 800° C. for 30 minutes. Carbon incorporation in the resultant TiN and TiN/Pt composite layers was then determined.

The control wafer had 21 atomic percent carbon, while each of the two wafers processed in accordance with the invention had 12 atomic percent carbon. Accordingly with the method of this invention, carbon content in the resultant film was significantly reduced. By utilizing post anneal of discrete layered stack constructions as opposed to post anneal of co-deposited constructions of the prior art (i.e., the Niemer et al. article), a method of greater practical utility is provided. The co-deposition Niemer et al. process has the distinct disadvantage and problem of chemical precursor poisoning. For example in Niemer et al., the platinum precursor and the TiN precursor undesirably compete with the desired TiN deposition reaction. These side precursor reactions adversely affect the deposition process and the composition of the resultant film apart form carbon incorporation. Such is eliminated by previous sputter deposition or ion implantation of the invention apart from the desired film deposition step.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical vapor deposition method of providing a layer of material atop a semiconductor wafer using an organometallic precursor, the method comprising the following steps:

positioning the wafer within a chemical vapor deposition reactor;

injecting an organometallic precursor and a carrier gas to within the reactor having the wafer positioned therein;

maintaining the reactor at a temperature and a pressure which in combination are effective to deposit a layer of material onto the wafer which incorporates metal and carbon from the organometallic precursor;

after depositing the layer of material, ion implanting a late transition metal into the layer to a selected dose; and after ion implanting, annealing the layer in the presence of a hydrogen source gas which effectively diffuses into the layer, hydrogen of the hydrogen source gas being catalyzed by the late transition metal within the layer into hydrogen atoms or radicals, the hydrogen atoms or radicals reacting with carbon in the layer to produce gaseous products which diffuse outwardly of the wafer and are expelled from the reactor.

2. The chemical vapor deposition method of claim 1 wherein the ion implantation provides an implant density of from $1 \times 10^{18}$ to $1 \times 10^{21}$ atoms/cm$^3$.

3. The chemical vapor deposition method of claim 1 wherein the organometallic precursor is a titanium organometallic precursor, and further comprising feeding a gaseous nitrogen source to the reactor during the deposition, the deposited layer predominantly comprising TiN.

4. The chemical vapor deposition method of claim 1 wherein the hydrogen source gas is selected from the group consisting of $H_2$, $SiH_4$, $B_2H_6$, $BH_3$, $NH_3$, and $H_2S$.

5. The chemical vapor deposition method of claim 1 wherein the hydrogen source gas comprises $H_2$.

6. The chemical vapor deposition method of claim 1 wherein the organometallic precursor is a titanium organometallic precursor, and further comprising feeding a gaseous nitrogen source to the reactor during the deposition, the deposited layer predominantly comprising TiN, and wherein the late transition metal comprises platinum.

7. The chemical vapor deposition method of claim 1 wherein the ion implantation provides and implant density of from $1 \times 10^{18}$ to $1 \times 10^{21}$ atoms/cm$^3$, and wherein the organometallic precursor is a titanium organometallic precursor, and further comprising feeding a gaseous nitrogen source to the reactor during the deposition, the deposited layer predominantly comprising TiN.

8. The chemical vapor deposition method of claim 1 wherein the late transition metal comprises platinum, and wherein the hydrogen source gas comprises $H_2$.

9. A chemical vapor deposition method of providing a layer of material atop a semiconductor wafer using an organometallic precursor, the method comprising the following steps:

positioning the wafer within a chemical vapor deposition reactor;

injecting an organometallic precursor and a carrier gas to within the reactor having the wafer positioned therein;

maintaining the reactor at a temperature and a pressure which in combination are effective to deposit a first layer of first material onto the wafer which incorporates metal and carbon from the organometallic precursor;

after depositing the first layer, depositing a discrete second layer of second material onto the wafer, the second layer comprising a late transition metal; and after depositing the discrete second layer, annealing the wafer in the presence of a hydrogen source gas which effectively diffuses into the first and second layers, hydrogen of the hydrogen source gas being catalyzed by the late transition metal within the second layer to form hydrogen atoms or radicals, the hydrogen atoms or radicals diffusing into the first layer and reacting with carbon in the first layer to produce gaseous products which diffuse outwardly of the wafer and are expelled from the reactor.

10. The chemical vapor deposition method of claim 9 wherein the second material of the second layer comprises a late transition metal in elemental form.

11. The chemical vapor deposition method of claim 9 wherein the second material of the second layer comprises a late transition metal in alloy form.

12. The chemical vapor deposition method of claim 9 wherein the second layer of second material is deposited by sputtering to provide the second material in the form of elemental or alloyed late transition metal.

13. The chemical vapor deposition method of claim 9 wherein the hydrogen source gas is selected from the group consisting of $H_2$, $SiH_4$, $B_2H_6$, $BH_3$, $NH_3$, and $H_2S$.

14. The chemical vapor deposition method of claim 9 wherein the hydrogen source gas comprises $H_2$.

15. A chemical vapor deposition method of providing a layer of material atop a semiconductor wafer using an organometallic precursor, the method comprising the following steps:

positioning the wafer within a chemical vapor deposition reactor;

injecting an organometallic precursor and a carrier gas to within the reactor having the wafer positioned therein;

maintaining the reactor at a temperature and a pressure which in combination are effective to deposit a first layer of first material onto the wafer which incorporates metal and carbon from the organometallic precursor;

depositing a second layer of second material onto the wafer, the second layer comprising a late transition metal;

alternatingly discrete depositing a plurality of first layers and a plurality of second layers atop one another; and after the alternatingly discrete depositions, annealing the wafer in the presence of a hydrogen source gas which effectively diffuses into the alternating first and second layers, hydrogen of the hydrogen source gas being catalyzed by the late transition metal within the second layers into hydrogen atoms or radicals, the hydrogen atoms or radicals diffusing into the first layers and reacting with carbon in the first layers to produce gaseous products which diffuse outwardly of the wafer and are expelled from the reactor.

16. The chemical vapor deposition method of claim 15 wherein the first layer is deposited to a thickness which is greater than that of the second layer.

17. The chemical vapor deposition method of claim 15 wherein the first layer is deposited to a thickness which is greater than that of the second layer, a finished composite of the deposited layers after the annealing step substantially comprising the first material.

18. The chemical vapor deposition method of claim 15 wherein the second material of the second layers comprises a late transition metal in elemental form.

19. The chemical vapor deposition method of claim 15 wherein the second material of the second layers comprises a late transition metal in alloy form.

20. The chemical vapor deposition method of claim 15 wherein the second layer is deposited to a thickness of from 2 Angstroms to 200 Angstroms.

21. The chemical vapor deposition method of claim 15 wherein the second layer is deposited to a thickness of from 2 Angstroms to 200 Angstroms, the first layer thickness being greater than that of the second layer, a finished composite of the deposited layers after the annealing step substantially comprising the first material.

22. The chemical vapor deposition method of claim 15 wherein the plurality of the second layers of second material are respectively deposited by, providing a gaseous form of a late transition metal within the reactor having the wafer positioned therein;

maintaining the reactor at a temperature and a pressure which in combination are effective to deposit a second layer of second material onto the wafer which incorporates the late transition metal.

23. The chemical vapor deposition method of claim 15 wherein the plurality of the second layers of second material are respectively deposited by sputtering to provide the second material in the form of elemental or alloyed late transition metal.

24. The chemical vapor deposition method of claim 15 wherein the hydrogen source gas is selected from the group consisting of $H_2$, $SiH_4$, $B_2H_6$, $BH_3$, $NH_3$, and $H_2S$.

25. The chemical vapor deposition method of claim 15 wherein the hydrogen source gas comprises $H_2$.

26. The chemical vapor deposition method of claim 15 wherein the hydrogen source gas comprises $H_2$, and the second material of the second layers comprises a late transition metal in elemental form.

27. The chemical vapor deposition method of claim 15 wherein the hydrogen source gas comprises $H_2$, and the second material of the second layers comprises a late transition metal in alloy form.

28. The chemical vapor deposition method of claim 15 wherein the organometallic precursor is a titanium organometallic precursor and the first material is titanium containing, and wherein the late transition metal comprises titanium.

* * * * *